United States Patent
Park et al.

(10) Patent No.: US 12,394,637 B2
(45) Date of Patent: Aug. 19, 2025

(54) SEMICONDUCTOR DEVICE AND METHOD OF PROCESSING STRIP OF ELECTRICAL COMPONENTS USING MESH JIG

(71) Applicant: STATS ChipPAC Pte. Ltd., Singapore (SG)

(72) Inventors: JoonSung Park, Incheon (KR); JiSu Han, Incheon (KR); WonSang Rhee, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 406 days.

(21) Appl. No.: 17/643,231

(22) Filed: Dec. 8, 2021

(65) Prior Publication Data

US 2023/0178384 A1  Jun. 8, 2023

(51) Int. Cl.
*H01L 21/56* (2006.01)
*H01L 21/683* (2006.01)
*H01L 23/00* (2006.01)

(52) U.S. Cl.
CPC .......... *H01L 21/568* (2013.01); *H01L 21/565* (2013.01); *H01L 21/6835* (2013.01); *H01L 24/16* (2013.01); *H01L 24/81* (2013.01); *H01L 24/97* (2013.01); *H01L 2224/16227* (2013.01); *H01L 2924/3511* (2013.01)

(58) Field of Classification Search
CPC . H01L 21/568; H01L 21/565; H01L 21/6835; H01L 24/16; H01L 24/81; H01L 24/97; H01L 2224/16227; H01L 2924/3511; H01L 2221/68309; H01L 23/10; H01L 23/16; H01L 23/3107; H01L 23/3121

USPC .......................................................... 257/30
See application file for complete search history.

(56) References Cited

U.S. PATENT DOCUMENTS

| | | | | |
|---|---|---|---|---|
| 5,528,462 | A * | 6/1996 | Pendse | H01L 23/4006 361/767 |
| 5,926,371 | A * | 7/1999 | Dolbear | H05K 1/0204 257/713 |
| 5,978,223 | A * | 11/1999 | Hamilton | H01L 23/4093 174/16.3 |
| 6,627,483 | B2 * | 9/2003 | Ondricek | G01R 1/0408 324/754.01 |

(Continued)

*Primary Examiner* — Norman D Richards
*Assistant Examiner* — Laura M Dykes
(74) *Attorney, Agent, or Firm* — Robert D. Atkins; PATENT LAW GROUP: Atkins and Associates, P.C.

(57) ABSTRACT

A semiconductor device has an interconnect substrate and an electrical component disposed over the substrate. A first carrier including a window is disposed over the interconnect substrate with the electrical component disposed within the window. A second carrier is disposed over the first carrier with a plurality of posts extending through the first carrier. The substrate is disposed over a third carrier. The posts may extend through the first carrier outside a footprint of the substrate. Alternatively, at least one of the posts extend through an opening in the substrate and the remaining posts are outside the footprint of the substrate. A plurality of pins extends from the second carrier to a dummy area of the substrate. Openings can be formed in a surface of the second carrier. The combination of first carrier, second carrier, and third carrier constitutes a mesh jig to support the strip of electrical components.

33 Claims, 20 Drawing Sheets

(56) References Cited

U.S. PATENT DOCUMENTS

| | | | |
|---|---|---|---|
| 7,495,922 B2* | 2/2009 | Ploeg | H01L 23/40 |
| | | | 257/718 |
| 8,283,777 B2 | 10/2012 | Lin et al. | |
| 8,373,269 B1 | 2/2013 | Hsiao et al. | |
| 10,541,211 B2 | 1/2020 | Sinha et al. | |
| 2006/0202325 A1* | 9/2006 | Coico | H01L 23/4006 |
| | | | 257/E23.084 |
| 2021/0035944 A1* | 2/2021 | Cheng | H01L 23/4006 |

* cited by examiner

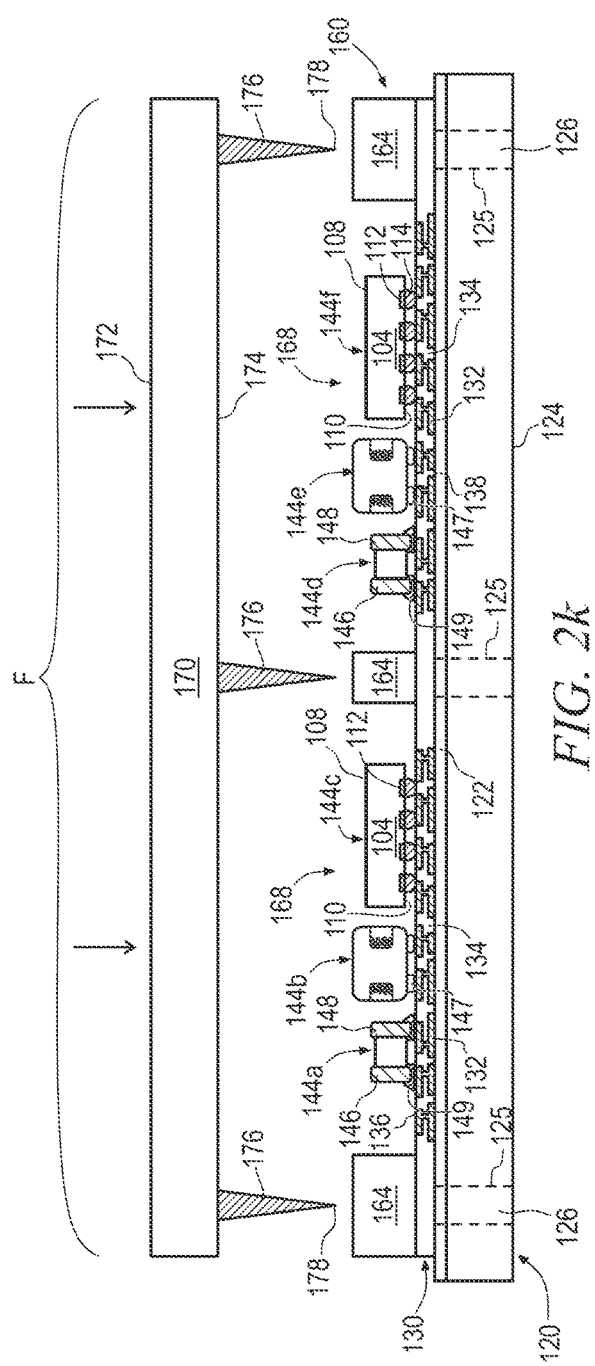
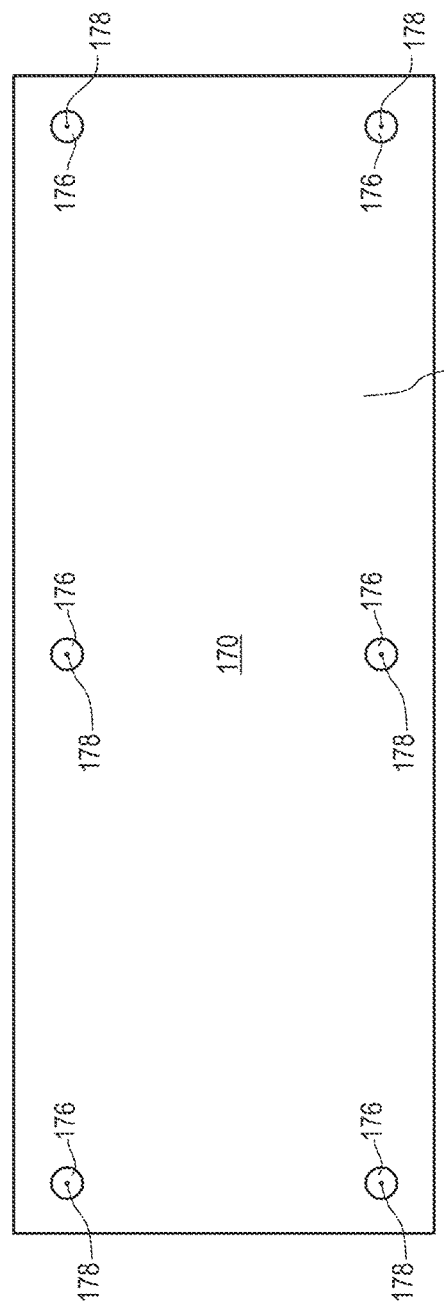

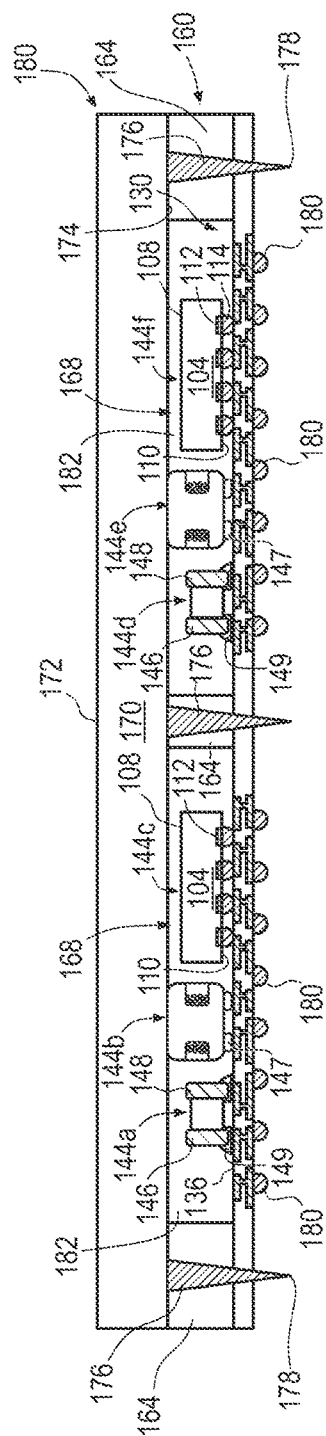
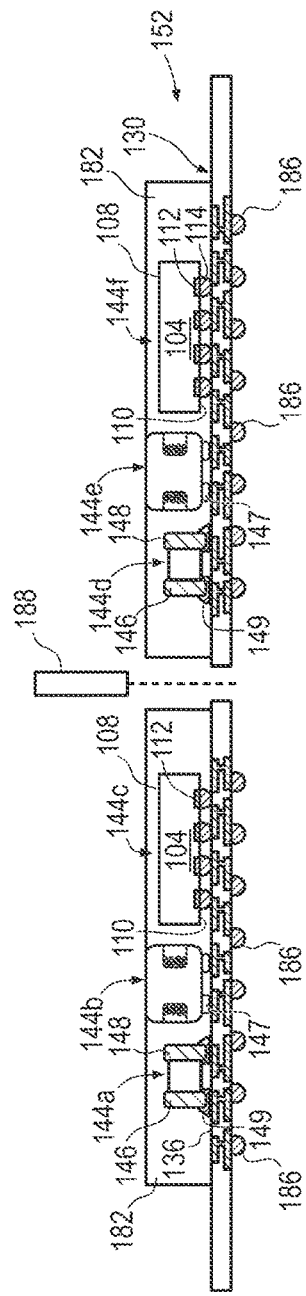
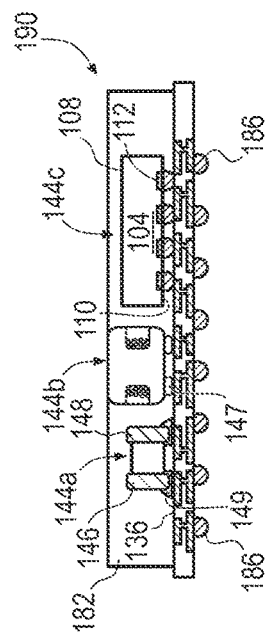
FIG. 4a
FIG. 4b
FIG. 4c

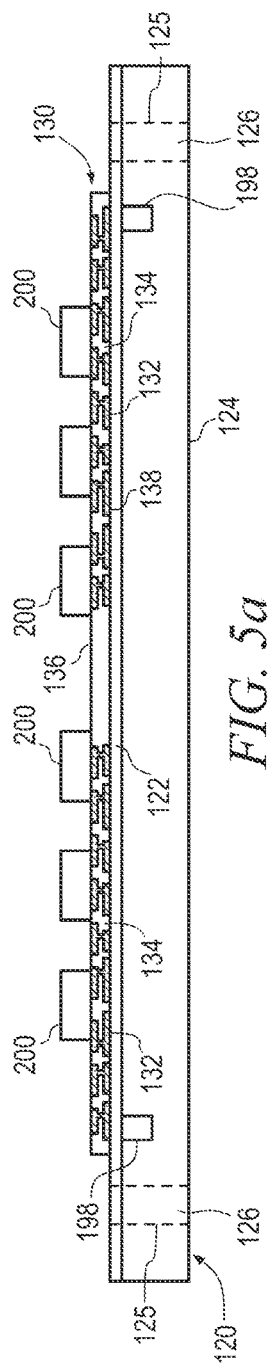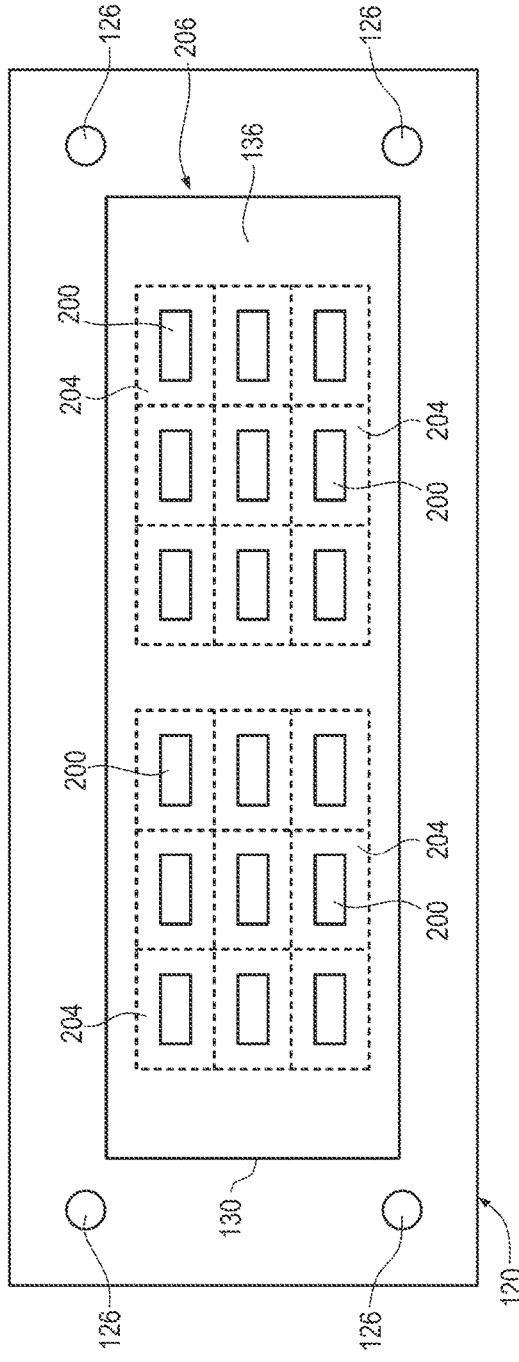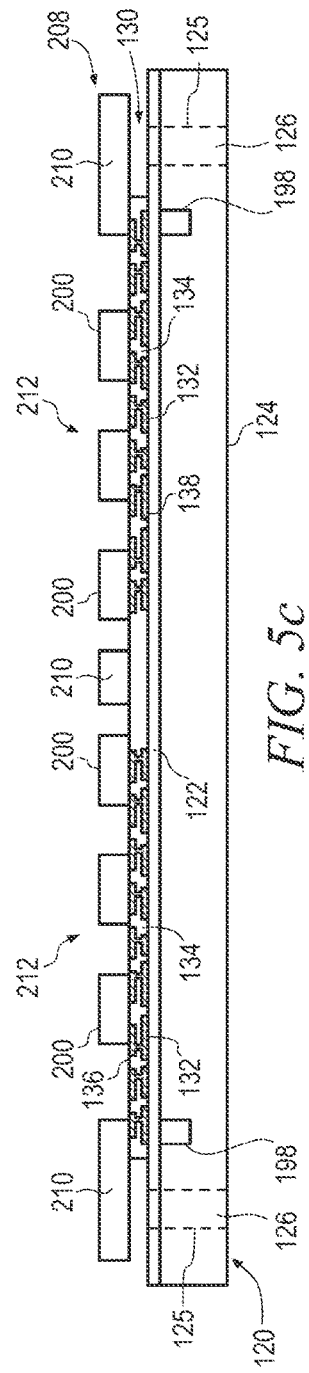

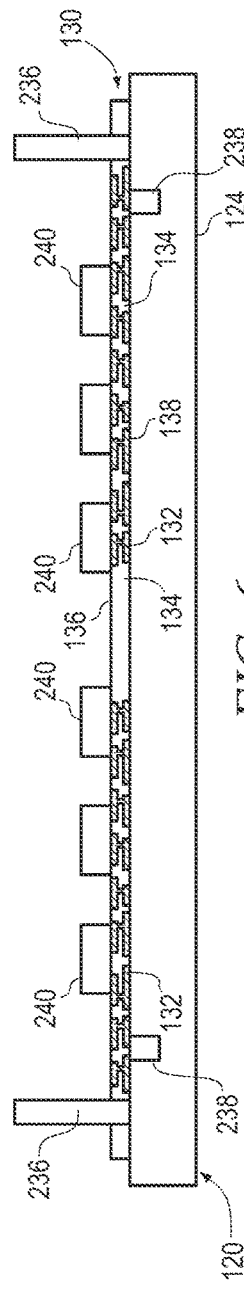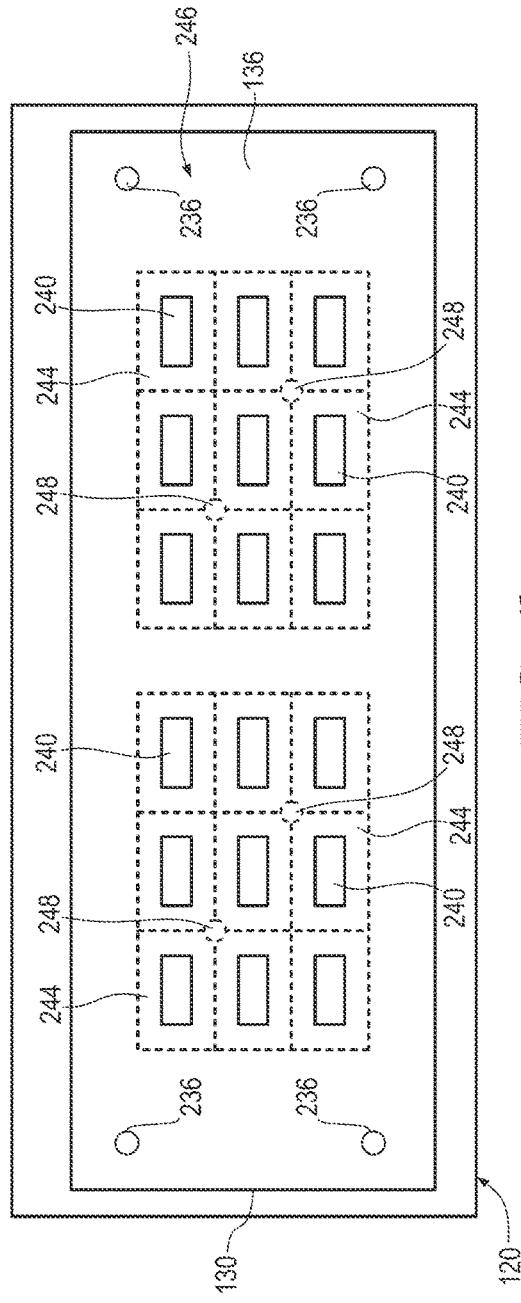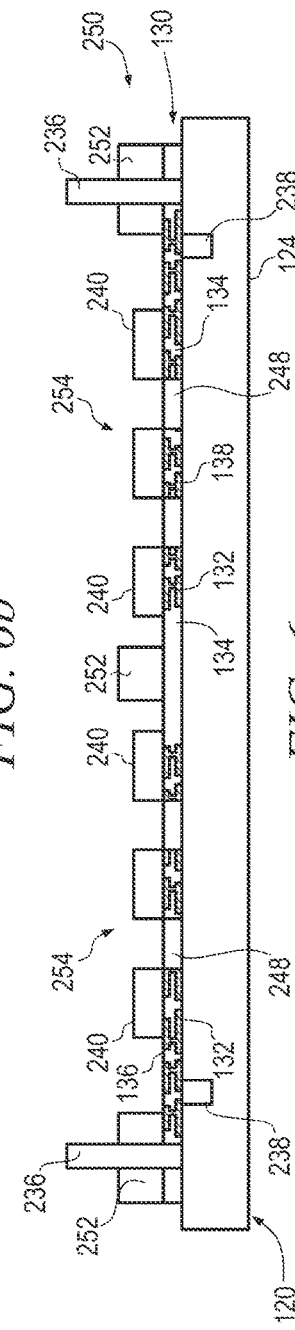
FIG. 6a
FIG. 6b
FIG. 6c

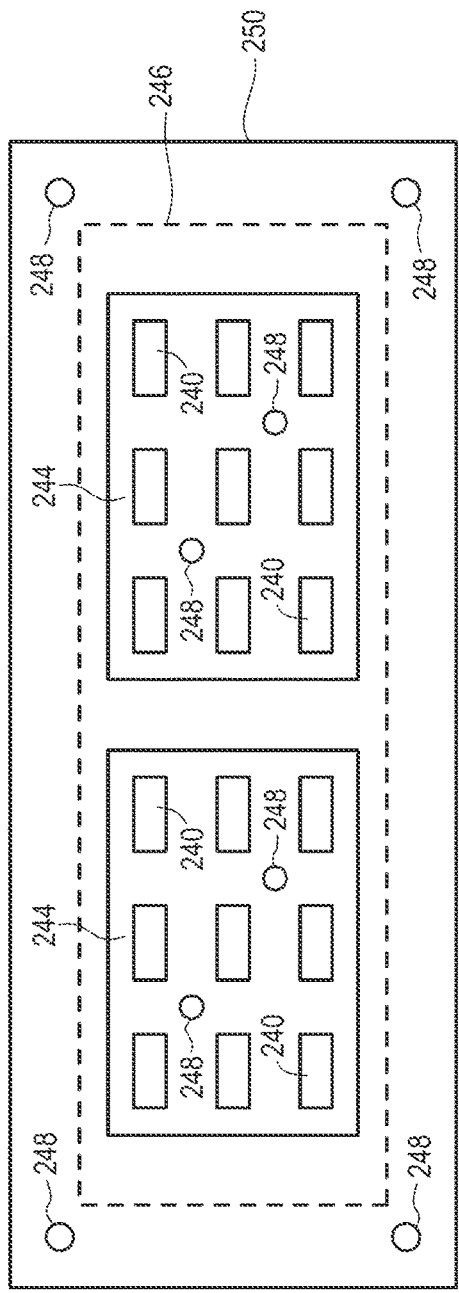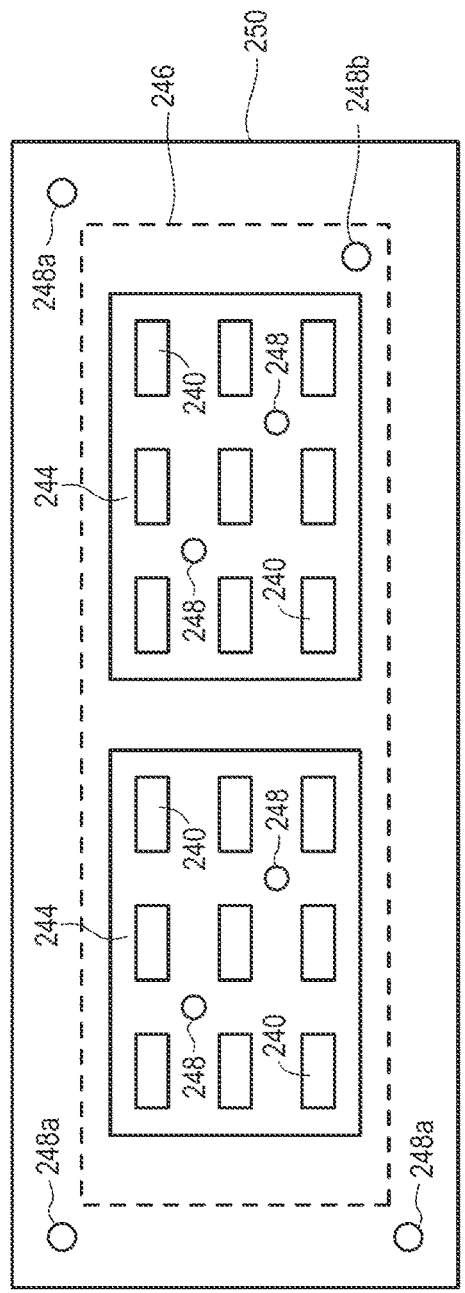
FIG. 7a
FIG. 7b

SEMICONDUCTOR DEVICE AND METHOD OF PROCESSING STRIP OF ELECTRICAL COMPONENTS USING MESH JIG

FIELD OF THE INVENTION

The present invention relates in general to semiconductor devices and, more particularly, to a semiconductor device and method of processing a strip of electrical components using a mesh jig.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Multiple individual semiconductor devices are often contained in one semiconductor package. The individual semiconductor devices are placed on an interconnect substrate, commonly known as a strip, in a repeating manufacturing pattern according to the electrical function of the semiconductor package. The strip is then reflowed to mechanically and electrically connect the individual semiconductor devices to the interconnect substrate. The semiconductor devices can also be encapsulated on the interconnect substrate. The strip is singulated into the individual semiconductor packages.

As semiconductor devices continue to decrease in size and increase in functionality, the density of the semiconductor devices on the strip (number of devices per unit area), increases as well. It is important that the high density semiconductor devices remain in place and do not move or shift during reflow. Warpage also becomes an issue given the smaller working scale of the manufacturing process.

BRIEF DESCRIPTION OF THE DRAWINGS

FIGS. 4a-4c illustrate removing the strip from the mesh jig and singulating the strip into a semiconductor package;

FIGS. 5a-5f illustrate another process of forming a mesh jig around a strip of electrical components;

FIGS. 6a-6g illustrate a process of forming a mesh jig around a strip of electrical components;

FIGS. 7a-7c illustrate another mesh jig around a strip of electrical components and FIG. 8 illustrates a printed circuit board (PCB) with different types of packages mounted to a surface of the PCB.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
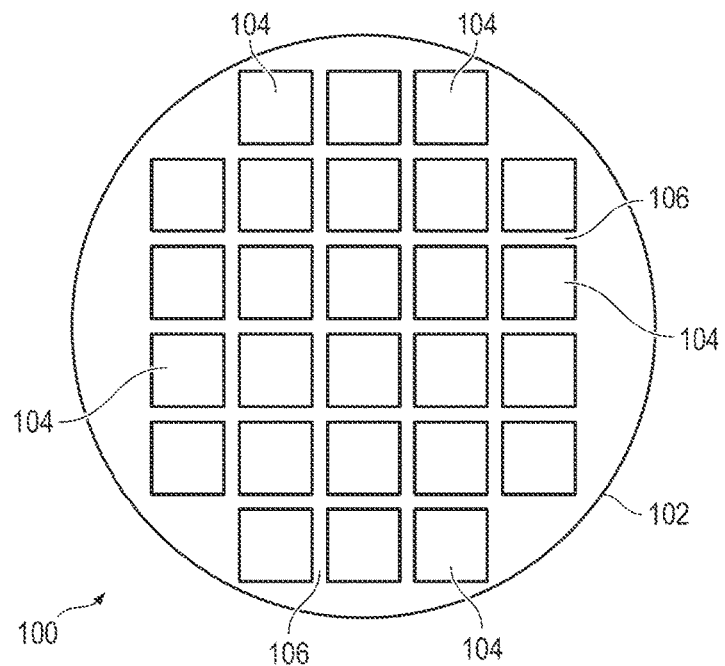
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
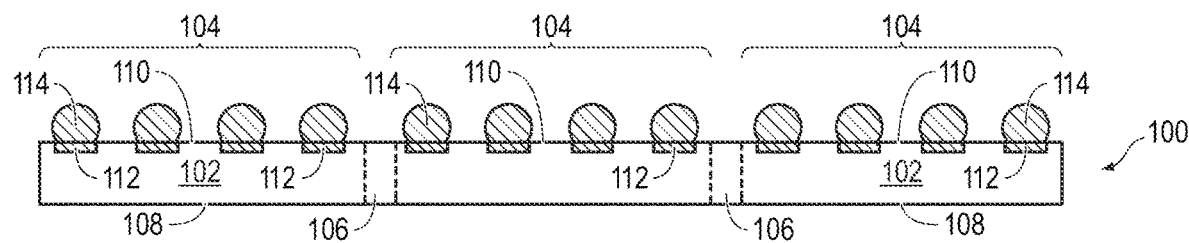

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

An electrically conductive bump material is deposited over conductive layer 112 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 112 using a suitable attachment or bonding process. In one embodiment, the bump material is reflowed by heating the material above its melting point to form balls or bumps 114. In one embodiment, bump 114 is formed over an under bump metallization (UBM) having a wetting layer, barrier layer, and adhesive layer. Bump 114 can also be compression bonded or thermocompression bonded to conductive layer 112. Bump 114 represents one type of interconnect structure that can be formed over conductive layer 112. The interconnect structure can also use bond wires, conductive paste, stud bump, micro bump, or other electrical interconnect.

Figure 1C:
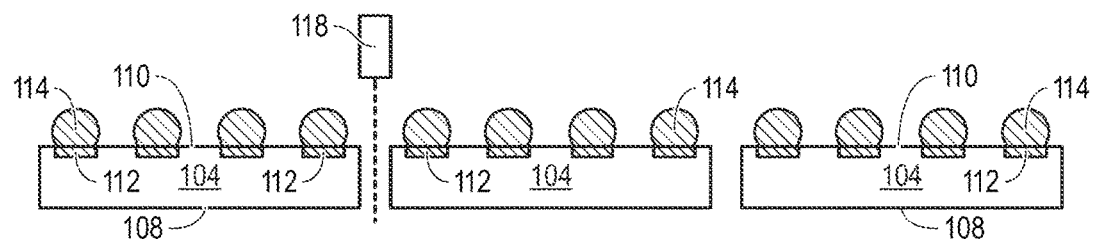

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die or unit (KGD/KGU) post singulation.

Figure 2A:
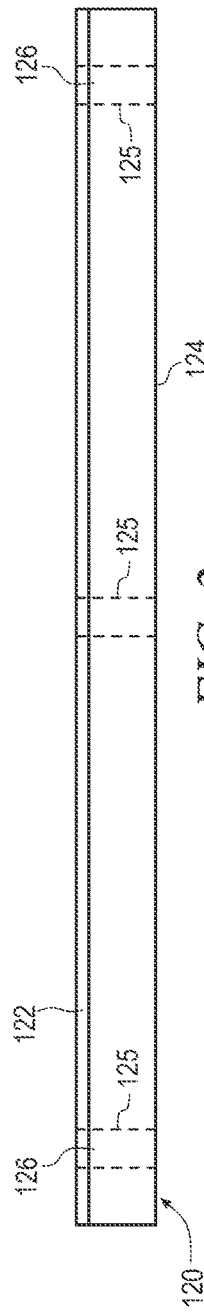
FIGS. 2a-2n illustrate a process of forming a mesh jig around a strip of electrical components.

FIGS. 2a-2n illustrate a process of forming a mesh jig around a strip of electrical components. FIG. 2a shows a cross-sectional view of a portion of carrier or temporary substrate 120 containing sacrificial or reusable base material such as silicon, polymer, beryllium oxide, glass, or other suitable low-cost, rigid material for structural support. An interface layer or double-sided tape 122 is formed over carrier 120 as a temporary adhesive bonding film, etch-stop layer, or thermal release layer. Carrier 120 has sufficient size to accommodate an interconnect substrate and multiple electrical components.

Figure 2B:
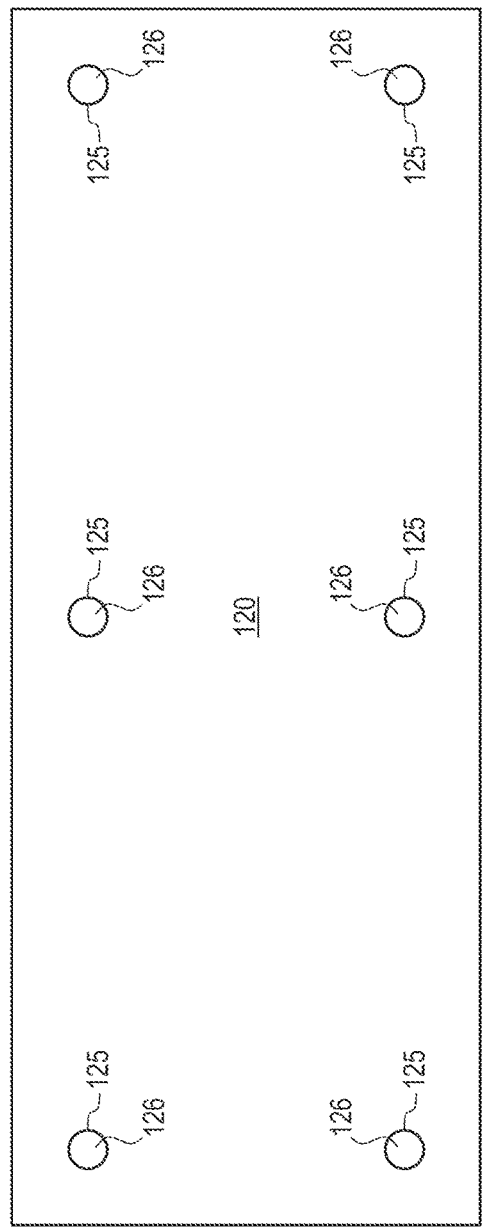

A plurality of vias 125 is formed through carrier 120 using laser drilling, mechanical drilling, deep reactive ion etching (DRIE), or other suitable process. The vias extend at least partially through carrier 120 and may extend completely through the carrier to surface 124. The vias are filled with penetrable material 126, such as a polymer, epoxy, acryl-based B-stage material, or other similar material with penetrable properties. FIG. 2b is a top view of carrier 120 with penetrable material 126 formed in vias 125.

Figure 2C:
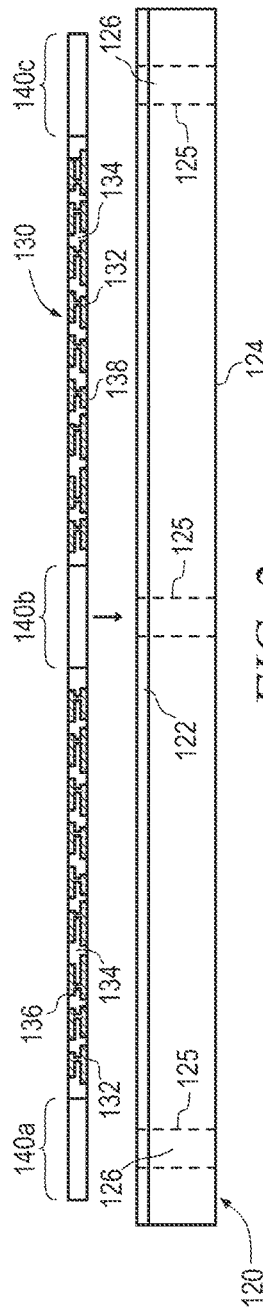

FIG. 2c shows a cross-sectional view of interconnect substrate 130 including conductive layers 132 and insulating layer 134. Conductive layer 132 can be one or more layers of Al, Cu, Sn, Ni, Au, Ag, or other suitable electrically conductive material. Conductive layer 132 provides horizontal electrical interconnect across substrate 130 and vertical electrical interconnect between top surface 136 and bottom surface 138 of substrate 130. Portions of conductive layer 132 can be electrically common or electrically isolated depending on the design and function of semiconductor die 104 and other electrical components. Insulating layer 134 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), and other material having similar insulating and structural properties. Insulating layer 134 provides isolation between conductive layers 132. In one embodiment, interconnect substrate 130 has a height of 0.17 mm.

Figure 2D:
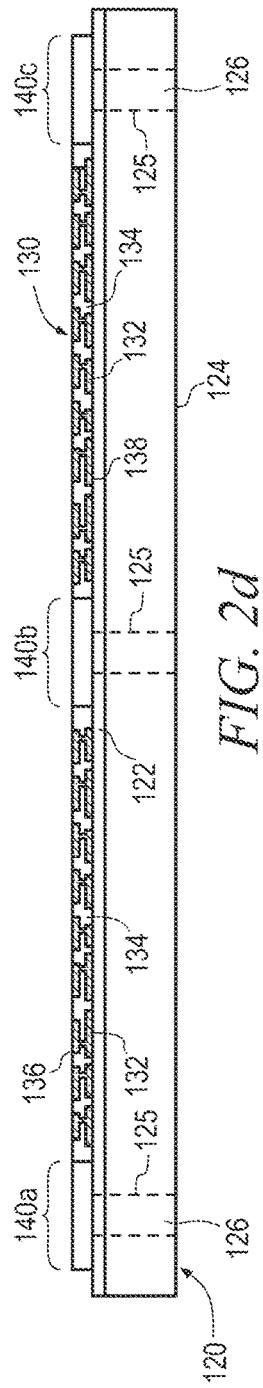

Areas 140a, 140b, and 140c of interconnect substrate are dummy areas with no electrical function. Later, pins will be driven through areas 140a-140c and into penetrable material 126. Interconnect substrate 130 is positioned over carrier 120 and then pressed into interface layer 122 of carrier 120. FIG. 2d shows interconnect substrate 130 with dummy areas 140a-140c bonded interface layer 122 of carrier 120.

Figure 2E:
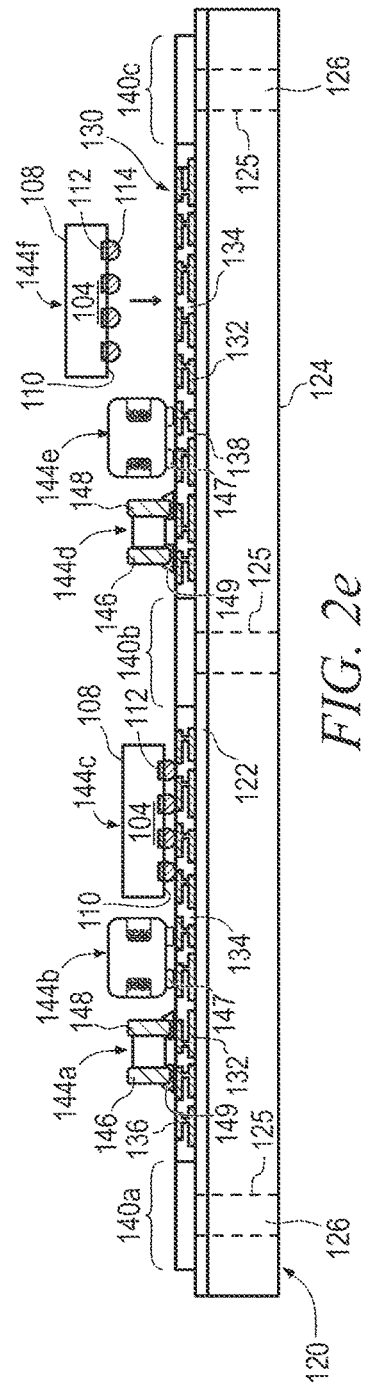
Figure 2F:
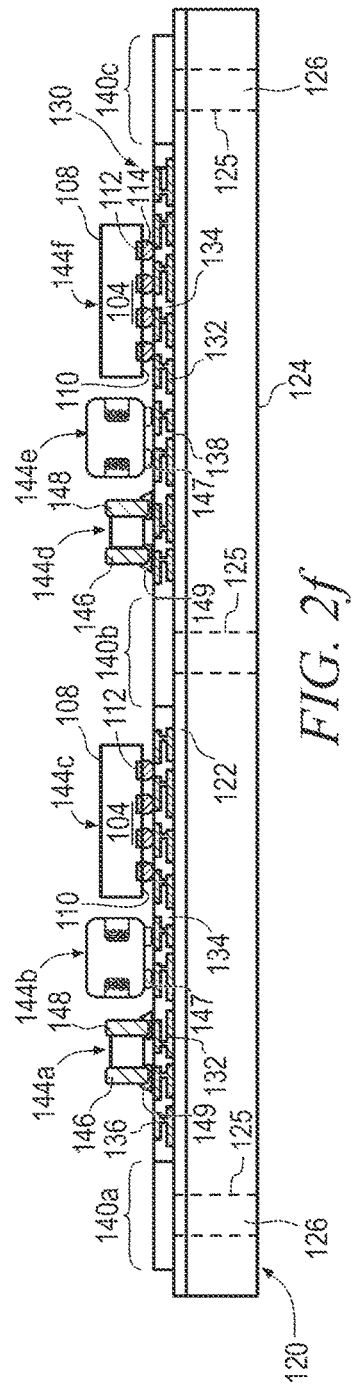
Figure 2G:
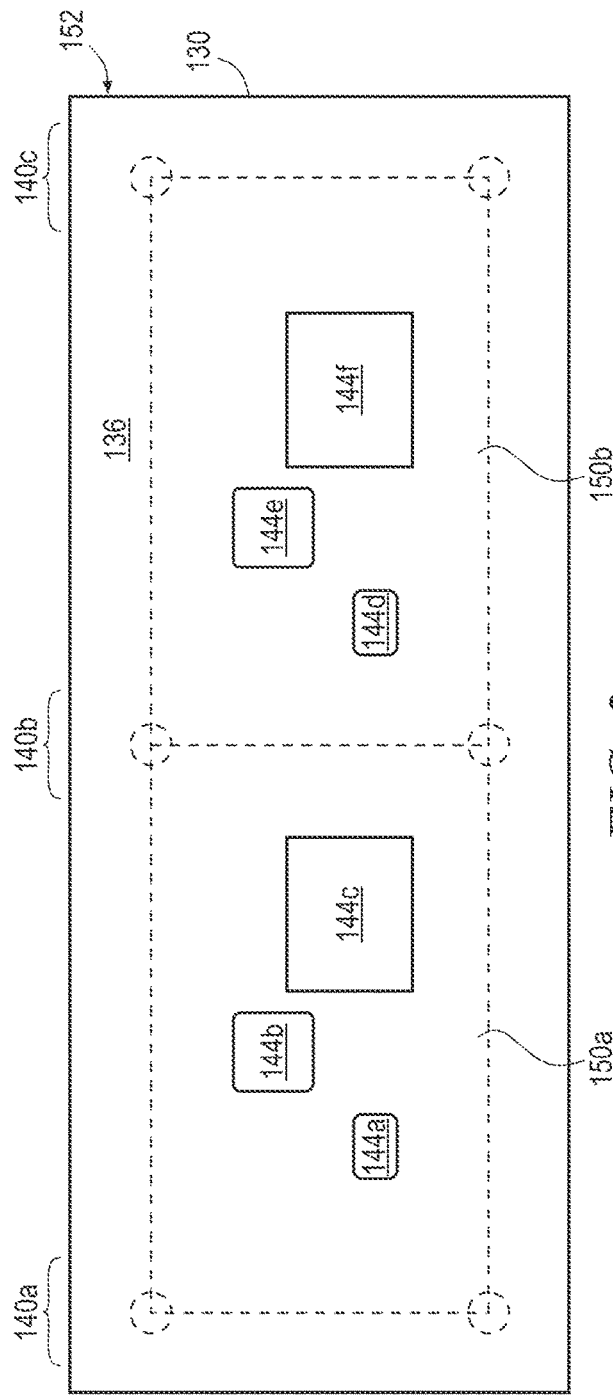

In FIGS. 2e-2g, electrical components 144a-144f are disposed over surface 136 of interconnect substrate 130. Electrical components 144a-144f are positioned over substrate 130 using a pick and place operation. For example, electrical components 144a, 144b, 144d, and 144e can be discrete semiconductor devices, such as resistors, capacitors, inductors, diodes, transistors, and the like. Terminals, such as 146 and 148, of each electrical component 144a, 144b, 144d, and 144e are disposed over surface 136 of interconnect substrate 130 with bumps 147 or conductive paste 149. Electrical components 144c and 144f can be semiconductor die 104 from FIG. 1c with active surface 110 and bumps 114 oriented toward surface 136 of substrate 130. Alternatively, electrical components 144a-144f can include other semiconductor die, semiconductor package, surface mount device, discrete electrical device, discrete transistor, diode, or IPD. In one embodiment, electrical components 144a-144f are surface mount devices or technology.

FIG. 2g is a top view of interconnect substrate 130 with electrical components 144a-144f disposed over surface 136. Electrical components 144a-144f are disposed in component attach areas 150a and 150b within the dashed lines. Electrical components 144a-144f can be disposed over interconnect substrate 130 prior to affixing the interconnect substrate to carrier 120. Interconnect substrate 130 with electrical components 144a-144f constitute a portion of strip 152 containing repeating manufactured electrical components combined to perform an electrical function within a semiconductor package. Electrical components 144a-144c constitute a first set of manufactured electrical components combined to perform an electrical function within a first semiconductor package. Electrical components 144d-144f constitute a second set of manufactured electrical components combined to perform an electrical function within a second semiconductor package.

Figure 2H:
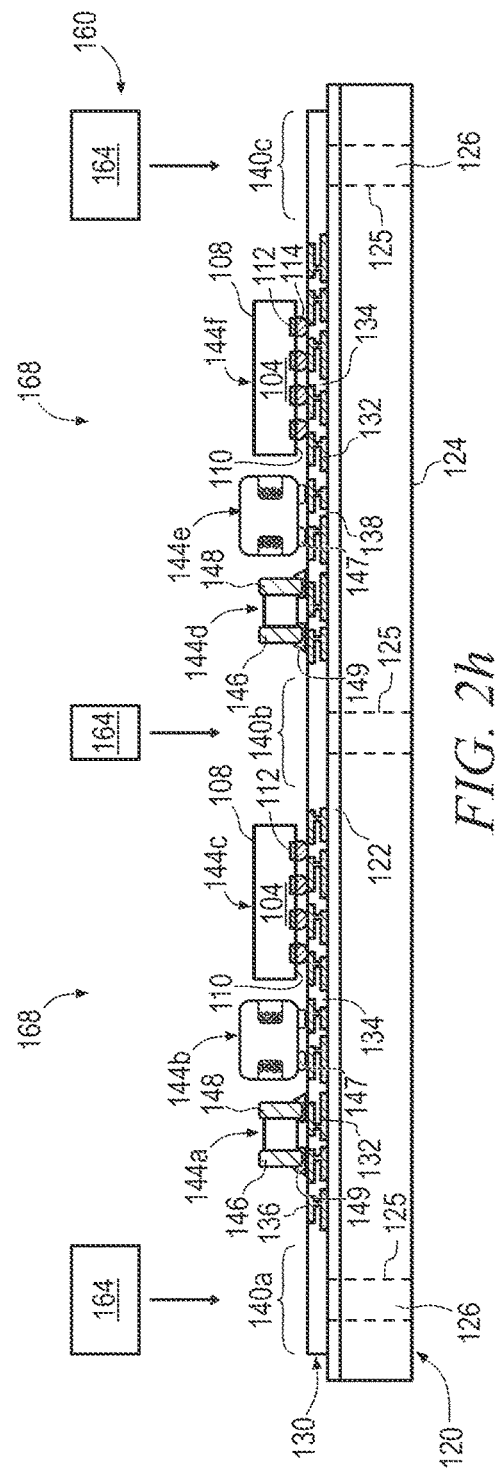
Figure 2I:
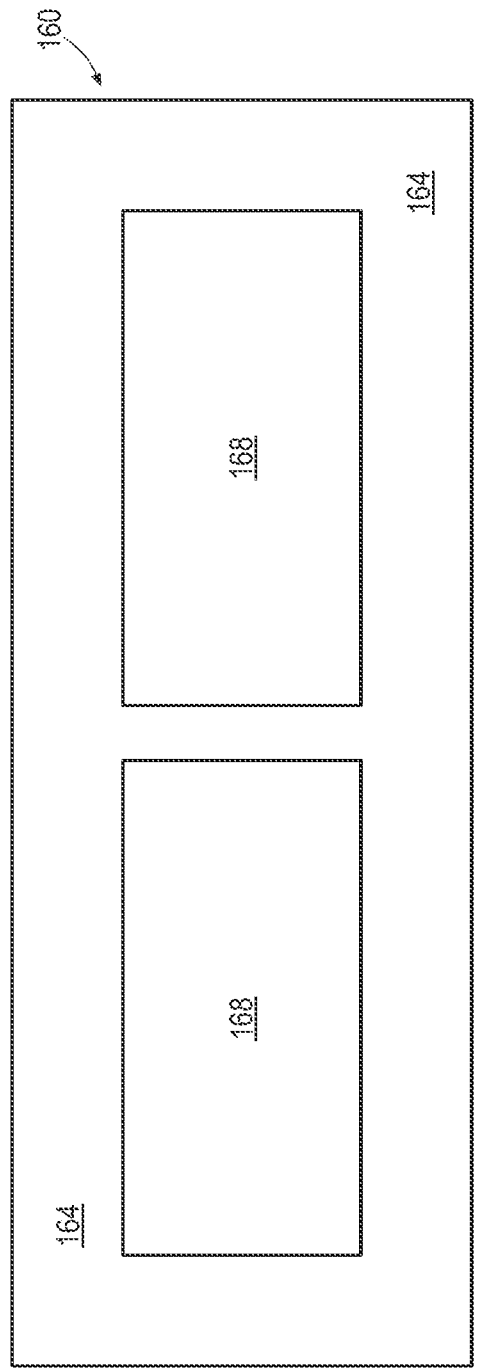
Figure 2J:
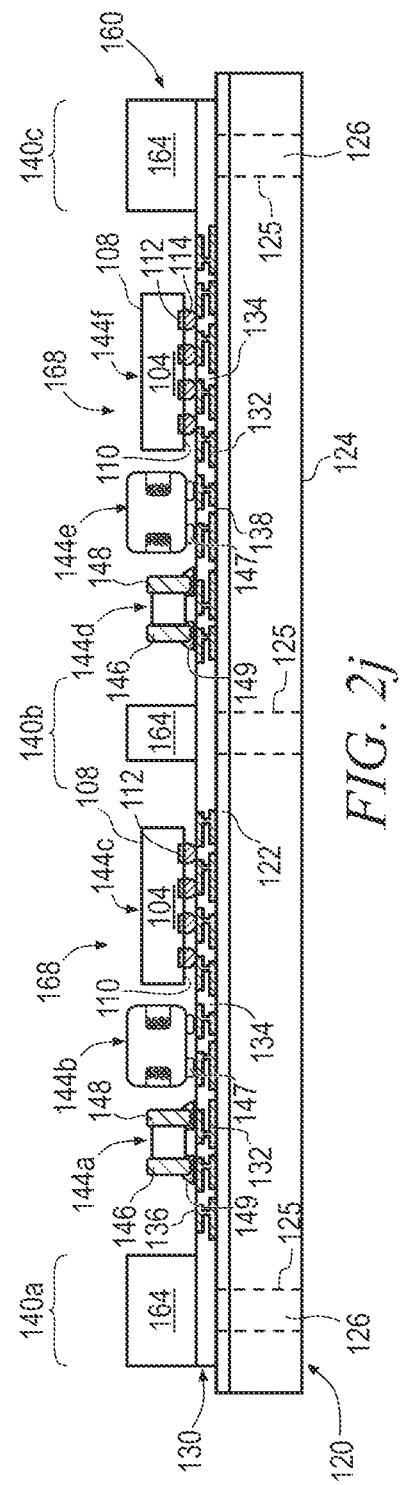
Figures 2M, 2N:
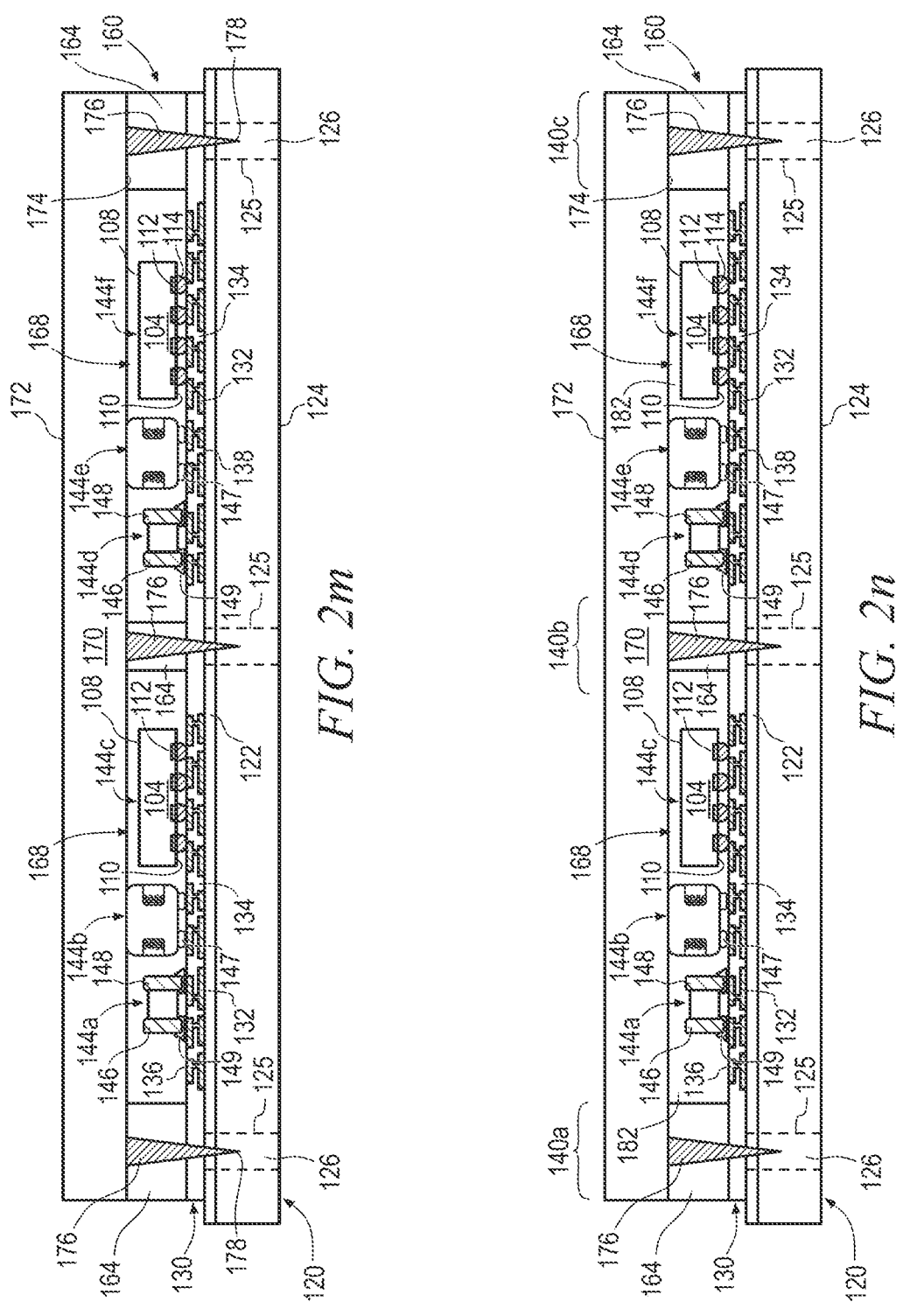

In FIG. 2h, carrier or substrate 160 is positioned over interconnect substrate 130 and carrier 120. Carrier 160 can be silicon, polymer, beryllium oxide, glass, or other suitable rigid material for structural support. In one embodiment, carrier 160 has a height of 1.0 mm. Carrier 160 includes body 164 aligned in part with dummy areas 140a-140c and openings or windows 168 aligned over component attach areas 150a and 150b of interconnect substrate 130. FIG. 2i is a top view of carrier 160 with body 164 and windows 168. FIG. 2j shows body 164 of carrier 160 disposed over dummy areas 140a-140c on surface 136 of interconnect substrate 130. Windows 168 expose component attach areas 150a-150b, and electrical components 144a-144f are disposed within windows 168.

In FIG. 2k, carrier or substrate 170 is positioned over interconnect substrate 130 and carrier 160. Carrier 170 can be silicon, polymer, beryllium oxide, glass, or other suitable rigid material for structural support. Carrier 170 includes surface 172 and surface 174 opposite surface 172. Carrier 170 may have a thickness of 2 mm. Pins or posts 176 made of metal, ceramic, or other rigid material with a sharpened distal end 178 extend from surface 174. Pins 176 are aligned with dummy areas 140a-140c. Pins 176 in dummy area 140a and 140c may be larger than pins in dummy area 140b. Carrier 170 is pressed onto carrier 160 with force F with pins 176 penetrating body 164 in dummy areas 140a-140c. Pins 176 are pushed through body 164, dummy areas 140a-140c, and into penetrable material 126 of carrier 120. FIG. 2l is a top view of carrier 170 and pins 176. FIG. 2m shows carrier 170 mounted to carrier 160 and pins 176 extending through body 164, dummy areas 140a-140c, and into penetrable material 126 of carrier 120. Electrical components 144a-144f are not damaged by pins 176 because the pins are located in dummy areas 140a-140c, outside component attach areas 150a-150b.

Figure 3A:
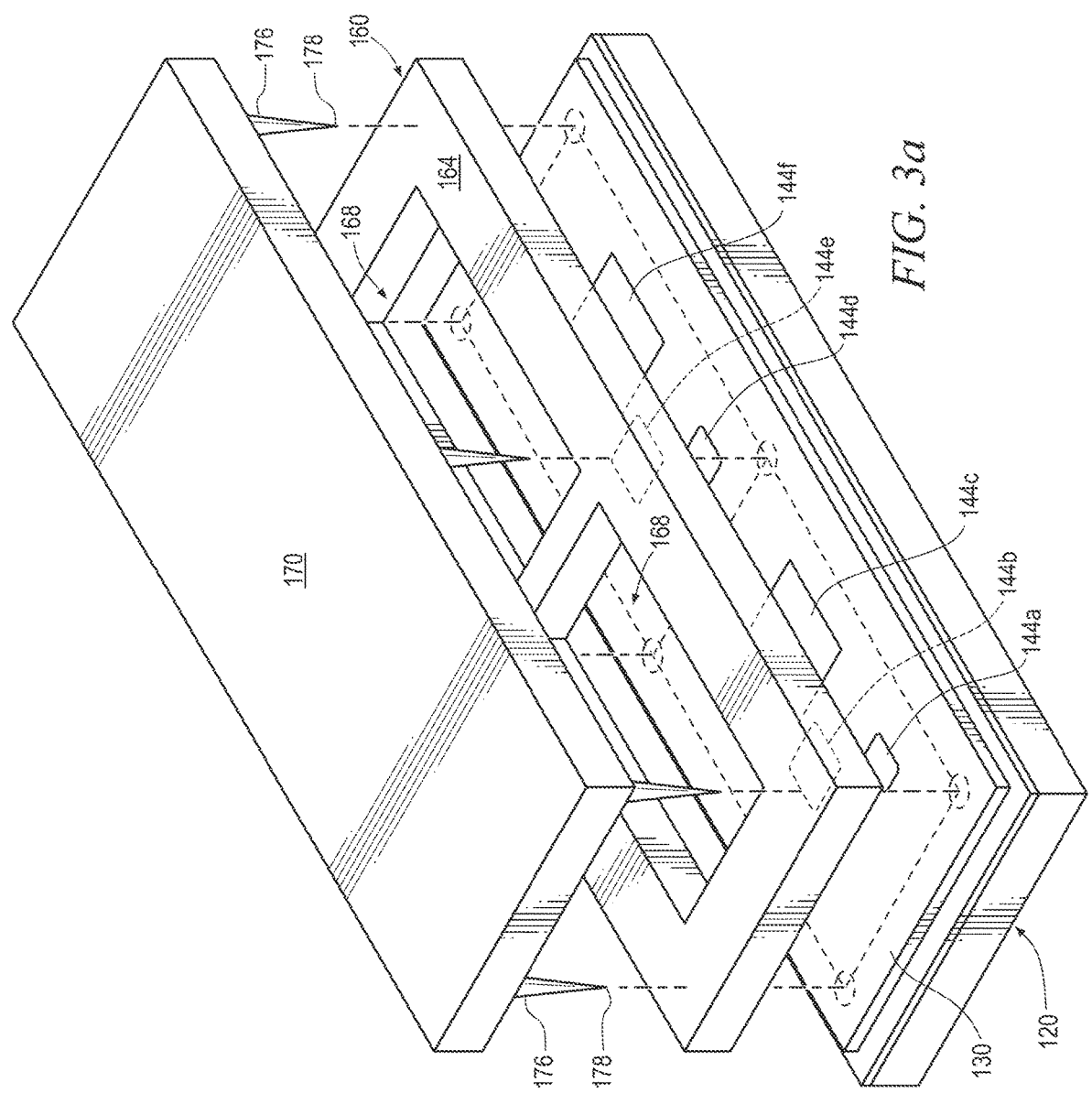
FIGS. 3a-3b illustrate a perspective view of the mesh jig.
Figure 3B:
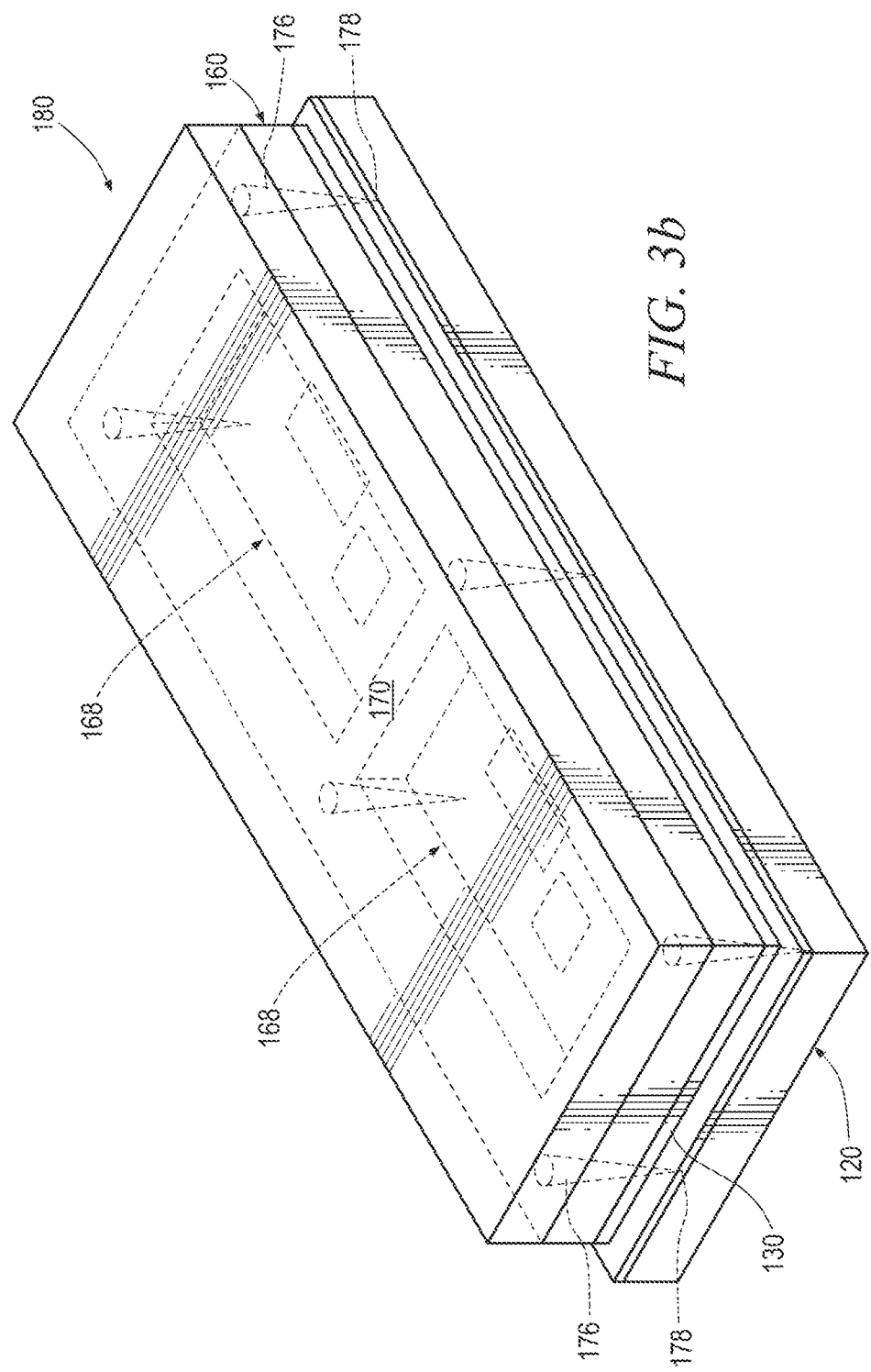

FIG. 3a is a perspective, exploded view of carrier 120, interconnect substrate 130, electrical components 144a-144f, carrier 160, and carrier 170 with pins 176. FIG. 3b shows a perspective view of carrier 120, interconnect substrate 130, electrical components 144a-144f, carrier 160, and carrier 170 with pins 176 joined together as mesh jig 180. Carrier 120 supports strip 152. Carrier 160 includes window 168 containing electrical components 144a-144f within component attach area 150a-150b. Carrier 170 with pins 176 extending through body 164, dummy areas 140a-140c, and into penetrable material 126 of carrier 120 holds all features together. Mesh jig 180 provides more physical control of strip 152 securely holding electrical components 144a-144f in place, particularly during reflow and encapsulation. Mesh jig 180 also reduces warpage of strip 152.

With electrical components 144a-144f securely held within mesh jig 180, bumps 114, bumps 147, and conductive paste 149 are reflowed to make mechanical and electrical connection to conductive layer 132. In FIG. 2n, encapsulant or molding compound 182 is deposited over and around electrical components 144a-144f and surface 136 of interconnect substrate 130 using a paste printing, compressive molding, transfer molding, liquid encapsulant molding, vacuum lamination, spin coating, or other suitable applicator. Encapsulant 182 can be polymer composite material, such as epoxy resin with filler, epoxy acrylate with filler, or polymer with proper filler. Encapsulant 182 is non-conductive, provides structural support, and environmentally protects the semiconductor device from external elements and contaminants.

In FIG. 4a, carrier 120 and interface layer 122 are removed by chemical etching, mechanical peel-off, CMP, mechanical grinding, thermal bake, ultra-violet (UV) light, laser scanning, or wet stripping to expose surface 138 of interconnect substrate 130. Bumps 186 can be formed on conductive layer 132 of surface 138. Carriers 160 and 170 are also removed leaving strip 152. In FIG. 4b, strip 152 can be singulated using saw blade or laser cutting tool 188 into individual semiconductor package 190, as in FIG. 4c.

Figure 5D:
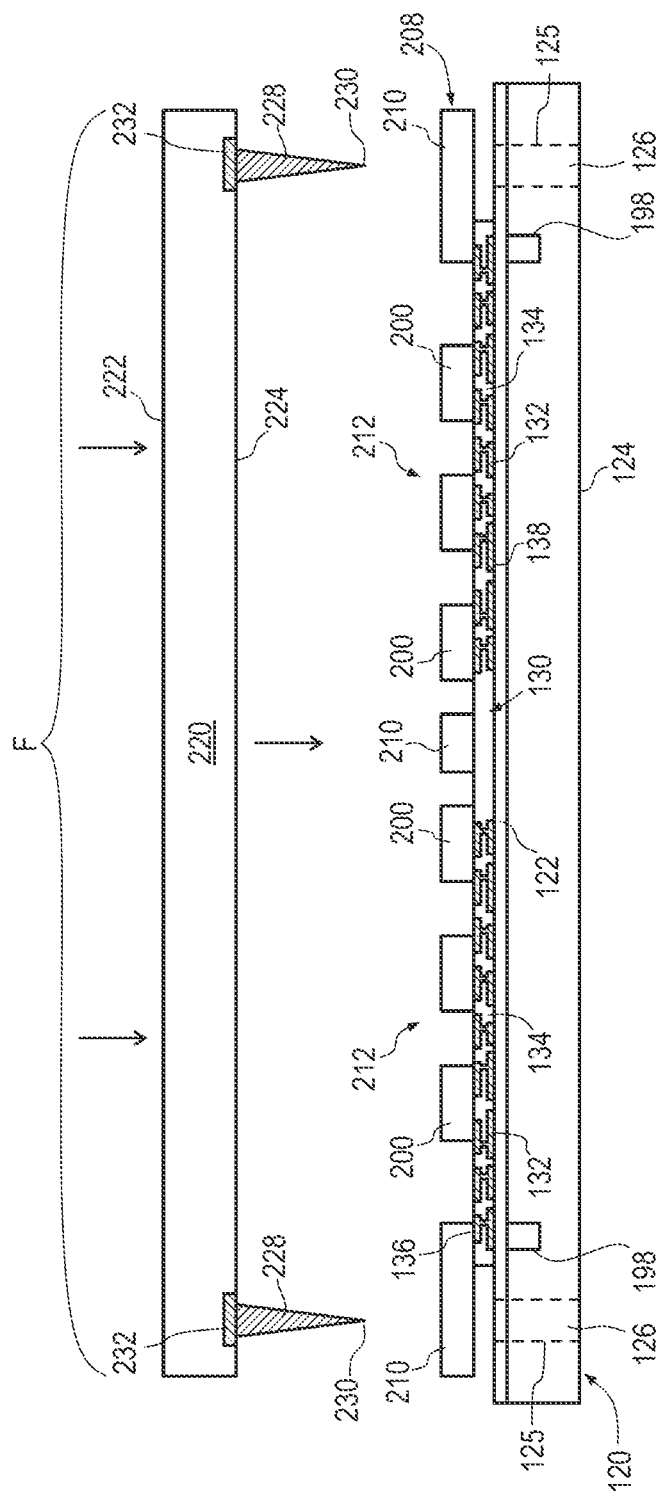

In another embodiment, FIGS. 5a-5f illustrate a process of forming a mesh jig around a strip of electrical components. Continuing from FIG. 2d, interconnect substrate 130 is attached to carrier 120 with interface layer 122 or magnets 198, as shown in FIG. 5a. Components having a similar function are assigned the same reference number in all figures. Electrical components 200 are disposed over surface 136 of interconnect substrate 130. Electrical components 200 are positioned over substrate 130 using a pick and place operation, similar to FIG. 2e. For example, electrical components 200 can be semiconductor die 104 from FIG. 1c with active surface 110 and bumps 114 oriented toward surface 136 of substrate 130. Electrical components 200 can be discrete semiconductor devices, such as resistors, capacitors, inductors, diodes, transistors, and the like. Alternatively, electrical components 200 can include other semiconductor die, semiconductor package, surface mount device, discrete electrical device, discrete transistor, diode, or IPD. In one embodiment, electrical components 200 are surface mount devices or technology.

FIG. 5b is a top view of interconnect substrate 130 with electrical components 200 disposed over surface 136. Electrical components 200 are disposed in component attach areas 204 within the dashed lines. Electrical components 200 can be disposed over interconnect substrate 130 prior to affixing the interconnect substrate to carrier 120. Interconnect substrate 130 with electrical components 200 constitute a portion of strip 206 containing repeating manufactured electrical components combined to perform an electrical function within a semiconductor package. Each electrical component 200 in FIG. 5a-5b can represent multiple electrical components.

In FIG. 5c, carrier or substrate 208 is mounted to interconnect substrate 130 and carrier 120, similar to FIGS. 2h-2j. Carrier 208 can be silicon, polymer, beryllium oxide, glass, or other suitable rigid material for structural support. Carrier 208 may have a thickness of 1 mm. Carrier 208 includes body 210 and openings or windows 212 aligned over component attach areas 204 of interconnect substrate 130. Windows 212 expose component attach areas 204, and electrical components 200 are disposed within windows 212.

Figure 5E:
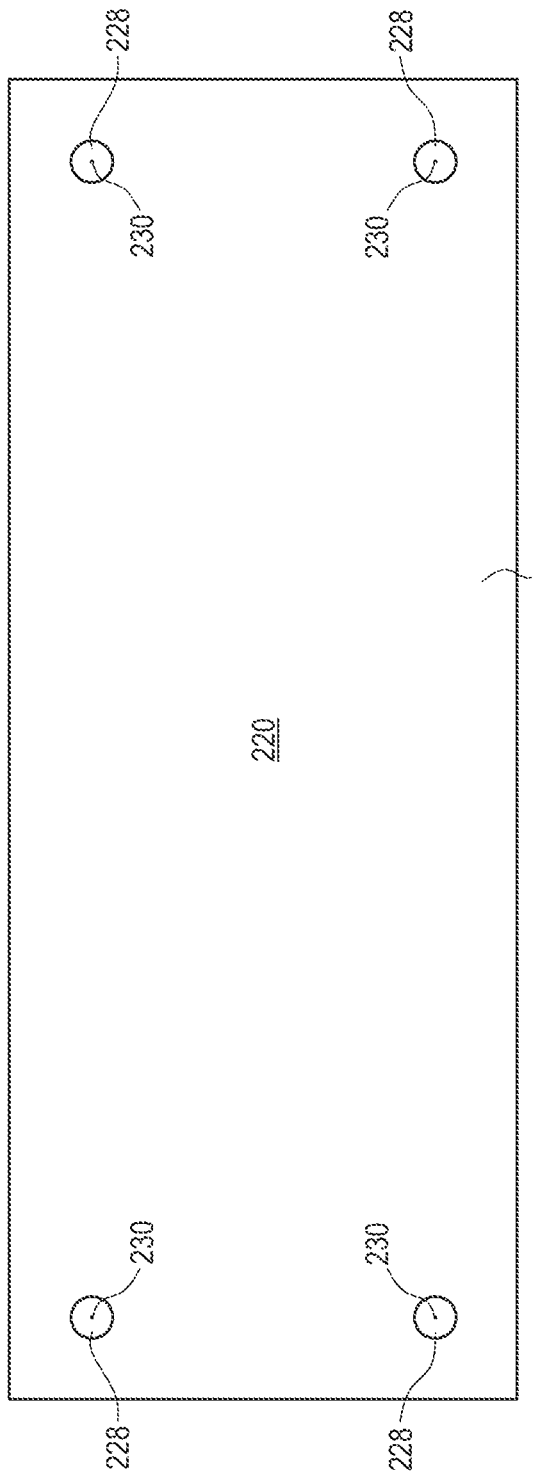
Figure 5F:
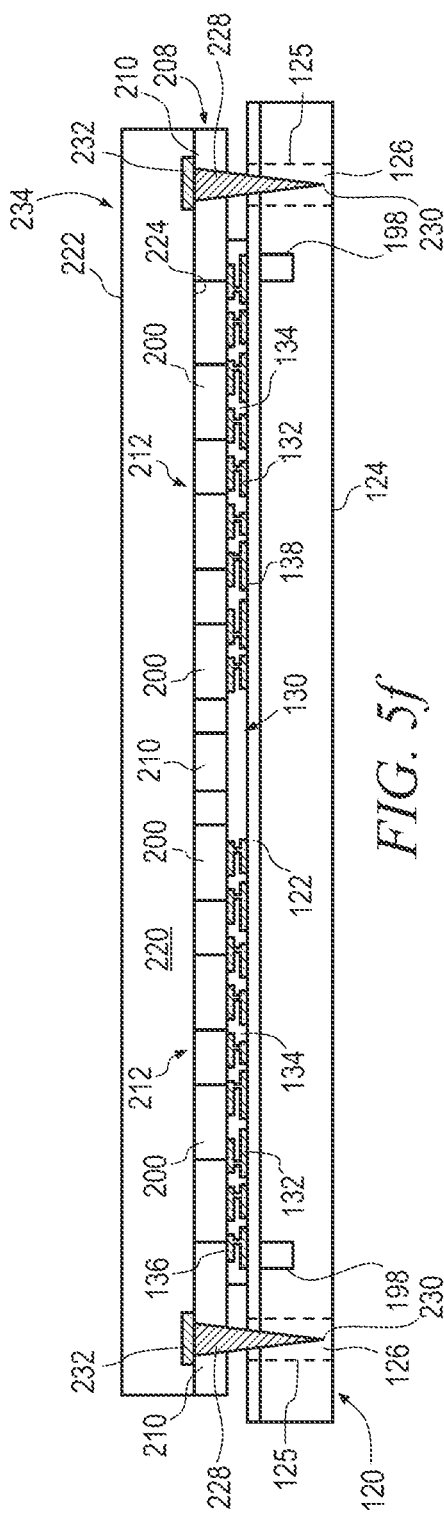

In FIG. 5d, carrier or substrate 220 is positioned over interconnect substrate 130 and carrier 208. Carrier 220 can be silicon, polymer, beryllium oxide, glass, or other suitable rigid material for structural support. Carrier 220 includes surface 222 and surface 224 opposite surface 222. Carrier 220 may have a thickness of 2 mm. Pins or posts 228 made of metal, ceramic, or other rigid material with a sharpened distal end 230 extend from surface 224. In one embodiment, pins 228 are formed over a silicon area 232 in carrier 220 to cushion the stress on the pins, compensate for pressure differences, and maintain coplanarity of strip 206. Pins 228 are aligned with penetrable material 126 in carrier 120. Strip 206 is smaller than the distance between pins 228, i.e., the pins are outside the strip. Carrier 228 is pressed onto carrier 208 with force F with pins 228 penetrating body 210. Pins 228 are pushed through body 210 and into penetrable material 126 of carrier 120. FIG. 5e is a bottom view of carrier 220 with pins 228 extending from surface 224. FIG. 5f shows carrier 220 mounted to carrier 208 and pins 228 extending through body 210 and into penetrable material 126 of carrier 120. Electrical components 200 and interconnect substrate 130 are not damaged by pins 228 because the pins are located outside strip 206.

Carrier 120 supports strip 206. Carrier 208 includes window 212 containing electrical components 200 within component attach area 204. Carrier 220 with pins 228 extending through body 210 and into penetrable material 126 of carrier 120 holds all features together. Mesh jig 234 provides more physical control of strip 206 securely holding electrical components 200 in place, particularly during reflow and encapsulation. Mesh jig 234 also reduces warpage of strip 206.

With electrical components 200 securely held within mesh jig 234, bumps 114 are reflowed to make mechanical and electrical connection to conductive layer 132, similar to FIG. 2m. An encapsulant can be deposited over and around electrical components 200 and surface 136 of interconnect substrate 130, similar to FIG. 2n. Carriers 120, 208, and 220 are removed, similar to FIGS. 4a-4b, leaving strip 206. Strip 206 can be singulated using saw blade or laser cutting tool, as in FIG. 4b, into individual semiconductor packages, as in FIG. 4c.

Figure 6D:
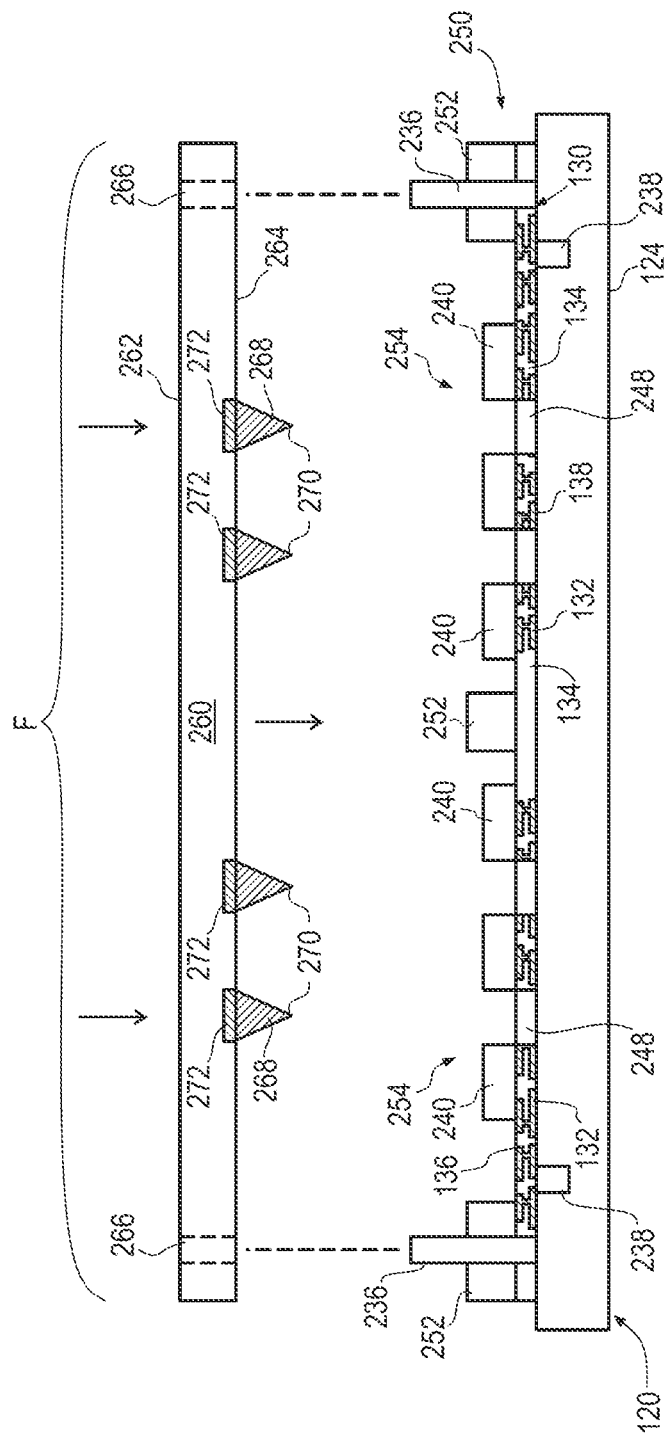

In another embodiment, FIGS. 6a-6g illustrate a process of forming a mesh jig around a strip of electrical components. Continuing from FIG. 2d, interconnect substrate 130 is attached to carrier 120 with posts or pins 236 and magnets 238, as shown in FIG. 6a. Posts 236 are formed as a solid body from carrier 120 and extend through openings in interconnect substrate 130. In one embodiment, posts 236 have a height of 2.6 mm. Electrical components 240 are disposed over surface 136 of interconnect substrate 130. Electrical components 240 are positioned over substrate 130 using a pick and place operation, similar to FIG. 2e. For example, electrical components 240 can be semiconductor die 104 from FIG. 1c with active surface 110 and bumps 114 oriented toward surface 136 of substrate 130. Electrical components 240 can be discrete semiconductor devices, such as resistors, capacitors, inductors, diodes, transistors, and the like. Alternatively, electrical components 240 can include other semiconductor die, semiconductor package, surface mount device, discrete electrical device, discrete transistor, diode, or IPD. In one embodiment, electrical components 240 are surface mount devices or technology.

FIG. 6b is a top view of interconnect substrate 130 with electrical components 240 disposed over surface 136. Electrical components 240 are disposed in component attach areas 244 within the dashed lines. Electrical components 240 can be disposed over interconnect substrate 130 prior to affixing the interconnect substrate to carrier 120. Interconnect substrate 130 with electrical components 240 constitute a portion of strip 246 containing repeating manufactured electrical components combined to perform an electrical function within a semiconductor package. Each electrical component 240 in FIG. 6a-6b can represent multiple electrical components. Dummy areas 248 of interconnect substrate 130 are provided for later pin contact. Dummy areas 248 have no electrical function. Posts or pins 236 extend through openings in interconnect substrate 130.

In FIG. 6c, carrier or substrate 250 is mounted to interconnect substrate 130 and carrier 120, similar to FIGS. 2h-2j. Carrier 250 can be silicon, polymer, beryllium oxide, glass, or other suitable rigid material for structural support. Carrier 250 includes body 252 and openings or windows 254 aligned over component attach areas 244 of interconnect substrate 130. Windows 254 expose component attach areas 244, and electrical components 240 are disposed within windows 254. In one embodiment, carrier 250 has a height of 1.0 mm. Posts 236 extend through openings in body 252.

Figure 6E:
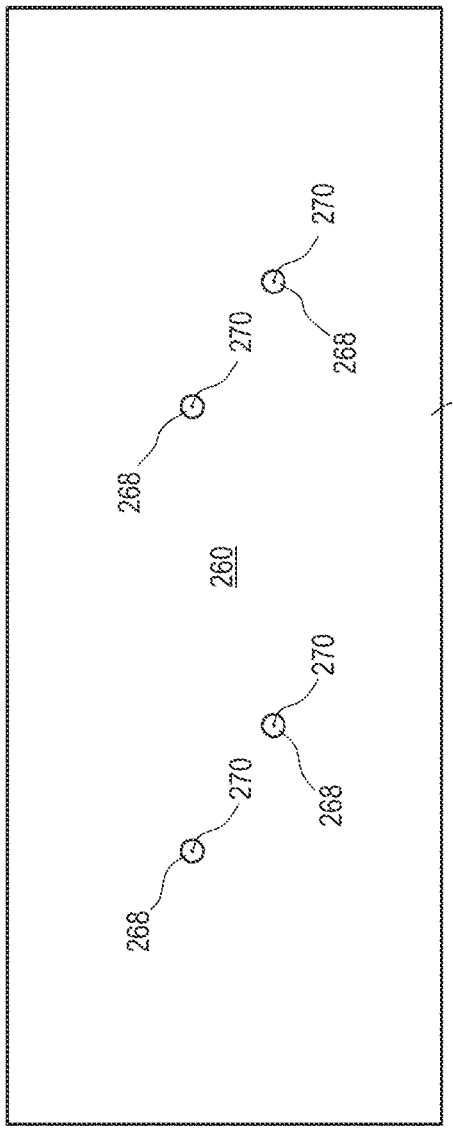
Figure 6F:
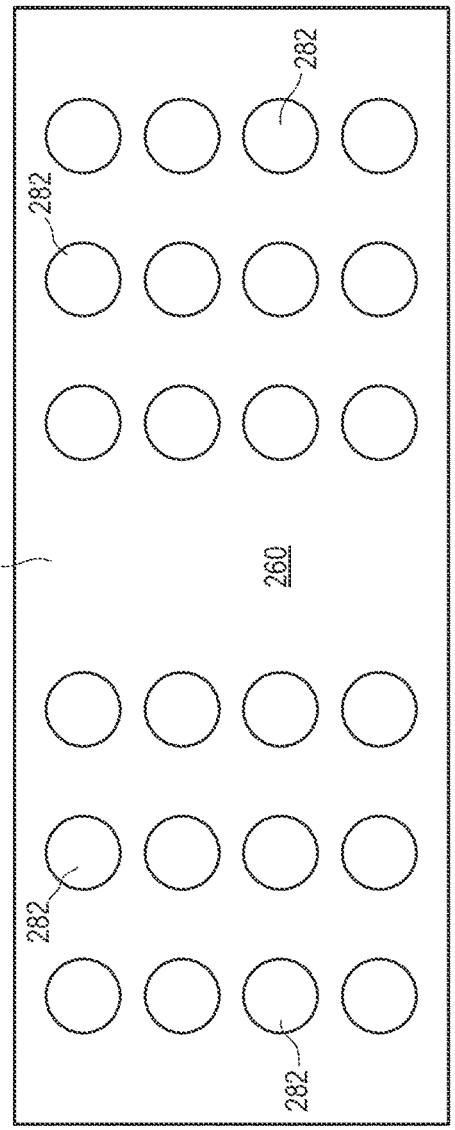

In FIG. 6d, carrier or substrate 260 is positioned over interconnect substrate 130 and carrier 250. Carrier 260 can be silicon, polymer, beryllium oxide, glass, or other suitable rigid material for structural support. Carrier 260 includes surface 262 and surface 264 opposite surface 262. Pins or posts 268, made of metal, ceramic, or other rigid material with a distal end 270, extend from surface 264. Pins 268 are formed over silicon area 272 in carrier 260 to cushion the stress on the pins, compensate for pressure differences, and maintain coplanarity of strip 246. FIG. 6e is a bottom view of carrier 260 with pins 268 extending from surface 264. Pins 268 are aligned with dummy areas 248 in interconnect substrate 130. In response to force F, carrier 260 is pressed against carrier 250 and pins 268 contact dummy areas 248 on interconnect substrate 130. Posts 236 extend through openings 266 in carrier 260. Pins 268 extend between electrical components 240 and contact dummy areas 248. Magnets 238 can be used to hold carrier 260 against carrier 250. FIG. 6f shows a plurality of openings or recesses 282 in surface 262 of carrier 260. Recesses 282 extend partially, but not completely, through carrier 260 to provide additional surface area for heat dissipation during reflow.

Figure 6G:
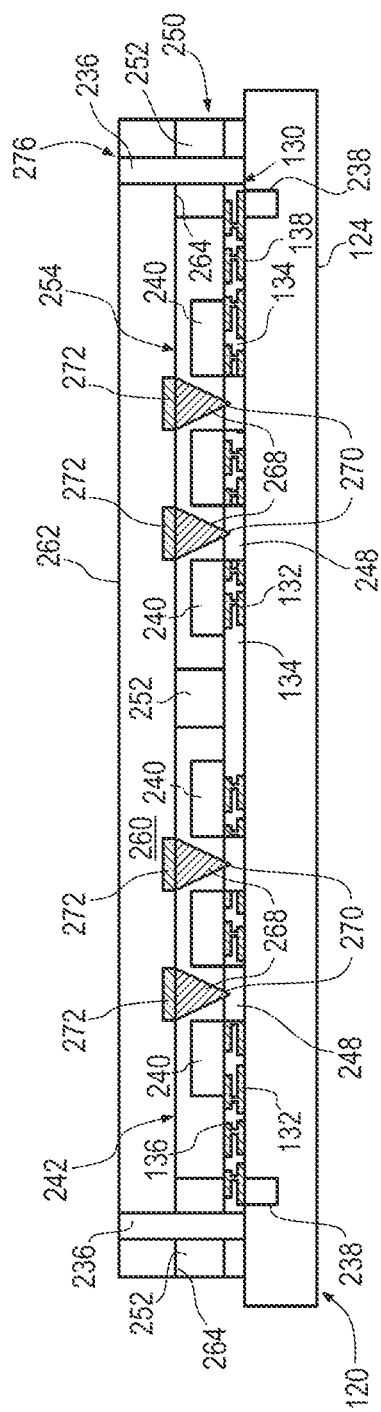

FIG. 6g shows carrier 260 mounted to carrier 250 with posts 236 extending through openings 266 in carrier 260, and pins 268 extending between electrical components 240 to contact dummy areas 248. Electrical components 240 are not damaged by pins 268 because the pins are located between the electrical components over dummy areas 248.

Carrier 120 supports strip 246. Carrier 252 includes window 254 containing electrical components 240 within component attach area 244. Carrier 260 with posts 236 extending through openings in strip 246 and through openings 266 in carrier 260, and further with pins 268 extending between electrical components 240 to contact dummy areas 248, hold all features together. Mesh jig 276 provides more physical control of strip 246 securely holding electrical components 240 in place, particularly during reflow and encapsulation. Mesh jig 276 also reduces warpage of strip 246.

With electrical components 240 securely held within mesh jig 276, bumps 114 are reflowed to make mechanical and electrical connection to conductive layer 132, similar to FIG. 2m. An encapsulant can be deposited over and around electrical components 240 and surface 136 of interconnect substrate 130, similar to FIG. 2n. Carriers 120, 250, and 260 are removed, similar to FIGS. 4a-4b, leaving strip 246. Strip 246 can be singulated using saw blade or laser cutting tool, as in FIG. 4b, into individual semiconductor packages, as in FIG. 4c.

In another embodiment, FIG. 7a shows carrier or substrate 250 mounted to strip 246, similar to FIGS. 2h-2j. Carrier 250 includes body 252 and openings or windows 254 aligned over component attach areas 244 of interconnect substrate 130. Windows 254 expose component attach areas 244, and electrical components 240 are disposed within windows 254. Openings 284 extend through body 252 but are outside the footprint of strip 246. Accordingly, posts 236 do not extend through strip 246.

Alternatively, some openings 284 extend through body 252 outside the footprint of strip 246 and some openings 284 extend through body 252 and strip 246. For example, in FIG. 7b, openings 284a extend through body 252 but are outside the footprint of strip 246, while opening 284b extend through body 252 and strip 246.

Figure 7C:
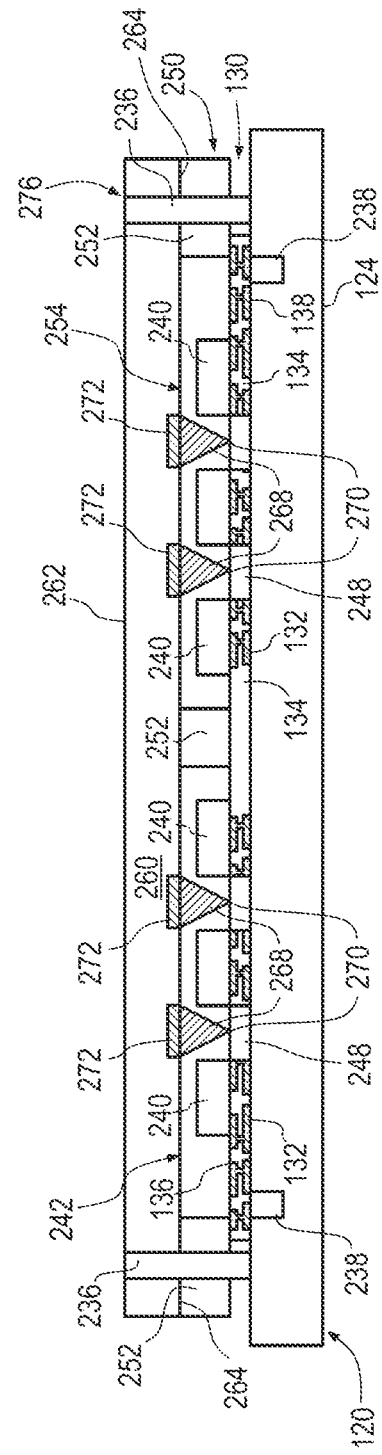

FIG. 7c shows mesh jig 280, similar to FIGS. 6a-6g, with interconnect substrate 130 terminating before some of posts 236, i.e. some posts do not extend through openings in the interconnect substrate, and some posts may extend through openings in the interconnect. The embodiments of FIGS. 7a-7c provide warpage control during reflow.

Figure 8:
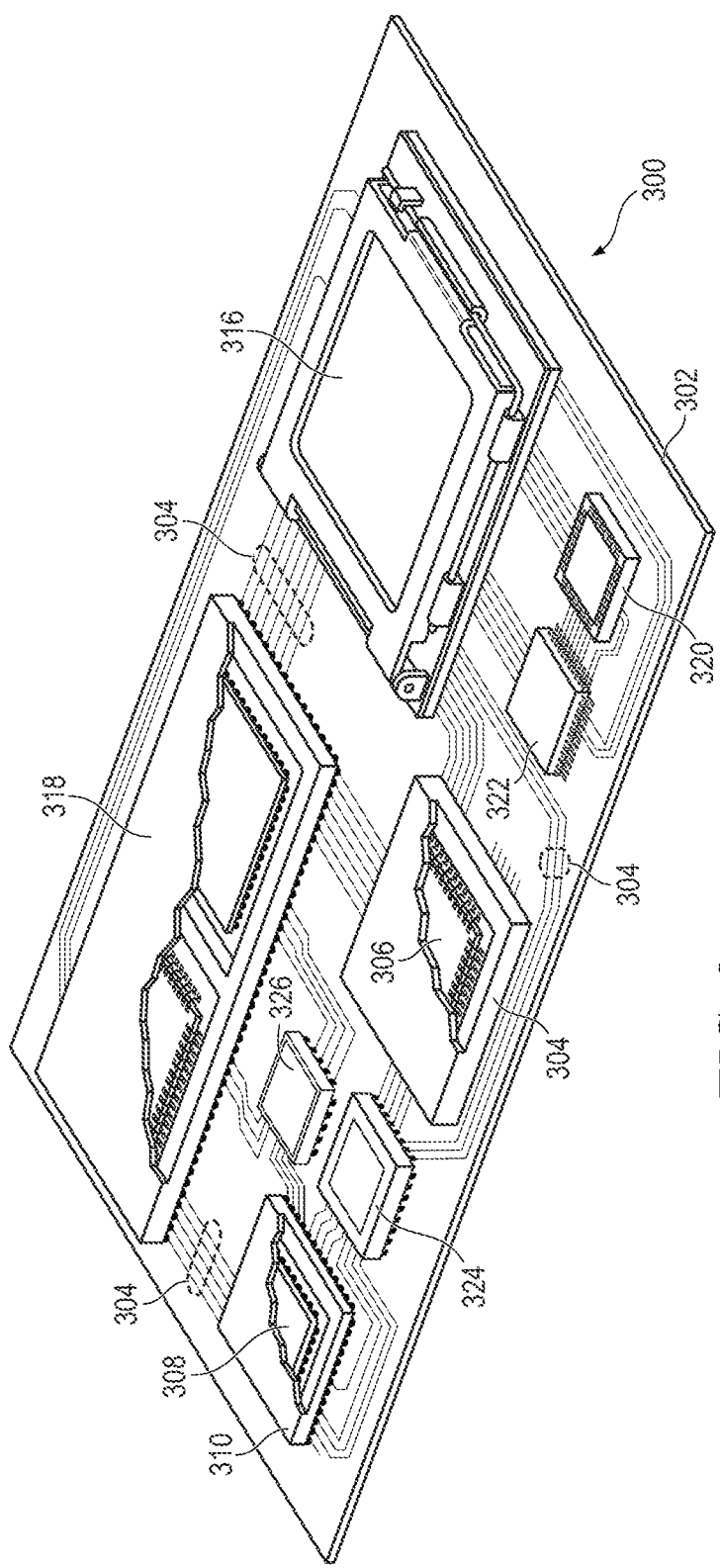

FIG. 8 illustrates electronic device 300 having a chip carrier substrate or PCB 302 with a plurality of semiconductor packages mounted on a surface of PCB 302, including semiconductor package 188. Electronic device 300 can have one type of semiconductor package, or multiple types of semiconductor packages, depending on the application.

Electronic device 300 can be a stand-alone system that uses the semiconductor packages to perform one or more electrical functions. Alternatively, electronic device 300 can be a subcomponent of a larger system. For example, electronic device 300 can be part of a tablet, cellular phone, digital camera, communication system, or other electronic device. Alternatively, electronic device 300 can be a graphics card, network interface card, or other signal processing card that can be inserted into a computer. The semiconductor package can include microprocessors, memories, ASIC, logic circuits, analog circuits, RF circuits, discrete devices, or other semiconductor die or electrical components. Miniaturization and weight reduction are essential for the products to be accepted by the market. The distance between semiconductor devices may be decreased to achieve higher density.

In FIG. 8, PCB 302 provides a general substrate for structural support and electrical interconnect of the semiconductor packages mounted on the PCB. Conductive signal traces 304 are formed over a surface or within layers of PCB 302 using evaporation, electrolytic plating, electroless plating, screen printing, or other suitable metal deposition process. Signal traces 304 provide for electrical communication between each of the semiconductor packages, mounted components, and other external system components. Traces 304 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB. For the purpose of illustration, several types of first level packaging, including bond wire package 306 and flipchip 308, are shown on PCB 302. Additionally, several types of second level packaging, including ball grid array (BGA) 310, bump chip carrier (BCC) 312, land grid array (LGA) 316, multi-chip module (MCM) or SIP module 318, quad flat non-leaded package (QFN) 320, quad flat package 322, embedded wafer level ball grid array (eWLB) 324, and wafer level chip scale package (WLCSP) 326 are shown mounted on PCB 302. In one embodiment, eWLB 324 is a fan-out wafer level package (Fo-WLP) and WLCSP 326 is a fan-in wafer level package (Fi-WLP). Depending upon the system requirements, any combination of semiconductor packages, configured with any combination of first and second level packaging styles, as well as other electronic components, can be connected to PCB 302. In some embodiments, electronic device 300 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a first substrate;
   disposing an electrical component over the first substrate;
   disposing a first carrier including a window over the first substrate, wherein the first carrier surrounds the electrical component as disposed within the window;
   disposing a second carrier over the first carrier to enclose the electrical component with the first carrier and second carrier; and
   providing a plurality of posts extending from the second carrier, wherein a sharpened distal end of the posts relative to the second carrier penetrates through penetrable material of the first carrier and further penetrates partially but not completely through penetrable material of the first substrate to hold the first carrier and second carrier in place by nature of the sharpened distal end of the posts contacting the penetrable material of the first substrate.

2. The method of claim 1, further including:
   providing a third carrier; and
   disposing the first substrate over the third carrier, wherein the plurality of posts extending from the second carrier further extend into the third carrier.

3. The method of claim 1, further including disposing a second substrate over the first substrate, wherein the posts extend through the first carrier outside a footprint of the second substrate.

4. The method of claim 1, wherein at least one of the posts extends through an opening in the first substrate.

5. The method of claim 1, wherein the plurality of posts extends from the second carrier to a dummy area of the first substrate.

6. The method of claim 1, further including forming a plurality of openings in a surface of the second carrier.

7. The method of claim 1, wherein disposing the electrical component over the first substrate further includes: disposing a plurality of electrical components over the first substrate, wherein the window of the carrier is sufficiently large to enclose the electrical components.

8. The method of claim 1, further including:
   depositing an encapsulant around the electrical component;
   removing the first substrate to expose the sharpened distal end of the posts;
   removing the first carrier; and
   removing the second carrier leaving the encapsulant deposited around the electrical component.

9. A method of making a semiconductor device, comprising:
   providing a substrate;
   disposing a first carrier including a window over the substrate;
   disposing a second carrier over the first carrier; and
   providing a plurality of posts extending from the second carrier, wherein a pointed distal end of the posts relative to the second carrier penetrates through penetrable material of the first carrier and further penetrates partially but not completely through penetrable material of the substrate to hold the first carrier and second carrier in place as the pointed distal end of the posts contacts the penetrable material of the substrate.

10. The method of claim 9, further including:
    providing a third carrier; and
    disposing the substrate over the third carrier.

11. The method of claim 9, wherein the posts extend through the first carrier outside a footprint of the substrate.

12. The method of claim 9, wherein at least one of the posts extends through an opening in the substrate.

13. The method of claim 9, wherein the plurality of posts extends from the second carrier to a dummy area of the substrate.

14. The method of claim 9, further including forming a plurality of openings in a surface of the second carrier.

15. The method of claim 9, further including disposing an electrical component over the substrate.

16. The method of claim 15, further including:
depositing an encapsulant around the electrical component;
removing the substrate to expose the sharpened distal end of the posts;
removing the first carrier; and
removing the second carrier leaving the encapsulant deposited around the electrical component.

17. The method of claim 9, further including disposing a plurality of electrical components over the first substrate, wherein the window of the carrier is sufficiently large to enclose the electrical components.

18. A semiconductor device, comprising:
a first substrate;
an electrical component disposed over the first substrate;
a first carrier including a window disposed over the first substrate, wherein the first carrier surrounds the electrical component as disposed within the window;
a second carrier disposed over the first carrier; and
a plurality of posts extending from the second carrier, wherein a sharpened distal end of the posts relative to the second carrier penetrates through penetrable material of the first carrier and further penetrates partially but not completely through penetrable material of the first substrate to hold the first carrier and second carrier in place by nature of the sharpened distal end of the posts contacting the penetrable material of the first substrate.

19. The semiconductor device of claim 18, further including a third carrier, wherein the first substrate is disposed over the third carrier.

20. The semiconductor device of claim 18 further including a second substrate disposed over the first substrate, wherein the posts extend through the first carrier outside a footprint of the second substrate.

21. The semiconductor device of claim 18, wherein at least one of the posts extends through an opening in the first substrate.

22. The semiconductor device of claim 18, wherein the plurality of posts extends from the second carrier to a dummy area of the first substrate.

23. The semiconductor device of claim 18, further including a plurality of openings formed in a surface of the second carrier.

24. The semiconductor device of claim 18, wherein the electrical component disposed over the first substrate further includes: a plurality of electrical components disposed over the first substrate, wherein the window of the carrier is sufficiently large to enclose the electrical components.

25. The semiconductor device of claim 18, wherein the posts have a circular base in contact with the second carrier and narrow to the sharpened distal end.

26. A semiconductor device, comprising:
a substrate;
a first carrier including a window disposed over the substrate;
a second carrier disposed over the first carrier; and
a plurality of posts extending from the second carrier, wherein a pointed distal end of the posts relative to the second carrier penetrates through penetrable material of the first carrier and further penetrates partially but not completely through penetrable material of the substrate to hold the first carrier and second carrier in place as the pointed distal end of the posts contacts the penetrable material of the substrate.

27. The semiconductor device of claim 26, further including a third carrier, wherein the substrate is disposed over the third carrier.

28. The semiconductor device of claim 26, wherein the posts extend through the first carrier outside a footprint of the substrate.

29. The semiconductor device of claim 26, wherein at least one of the posts extends through an opening in the substrate.

30. The semiconductor device of claim 26, wherein the plurality of posts extends from the second carrier to a dummy area of the substrate.

31. The semiconductor device of claim 26, further including a plurality of openings formed in a surface of the second carrier.

32. The semiconductor device of claim 26, further including a plurality of electrical components disposed over the first substrate, wherein the window of the carrier is sufficiently large to enclose the electrical components.

33. The semiconductor device of claim 26, wherein the posts have a circular base in contact with the second carrier and narrow to the pointed end.

* * * * *